(12) United States Patent
Kim et al.

(10) Patent No.: US 11,881,791 B2
(45) Date of Patent: Jan. 23, 2024

(54) ELECTROMAGNETIC SHIELDING POWER CONVERSION DEVICE

(71) Applicant: Hitachi Automotive Systems, Ltd., Hitachinaka (JP)

(72) Inventors: Taesung Kim, Hitachinaka (JP); Hiroki Funato, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 514 days.

(21) Appl. No.: 17/255,661

(22) PCT Filed: Jun. 17, 2019

(86) PCT No.: PCT/JP2019/023808
§ 371 (c)(1),
(2) Date: Dec. 23, 2020

(87) PCT Pub. No.: WO2020/008843
PCT Pub. Date: Jan. 9, 2020

(65) Prior Publication Data
US 2021/0273580 A1    Sep. 2, 2021

(30) Foreign Application Priority Data
Jul. 4, 2018    (JP) .................................. 2018-127411

(51) Int. Cl.
*H02M 7/48*    (2007.01)
*H02K 11/33*    (2016.01)
(Continued)

(52) U.S. Cl.
CPC .............. *H02M 7/48* (2013.01); *H02K 11/33* (2016.01); *H02M 1/44* (2013.01); *H02M 7/003* (2013.01); *H05K 7/20927* (2013.01)

(58) Field of Classification Search
CPC .......... H02M 7/48; H02M 1/44; H02M 7/003; H02K 11/33; H05K 7/20927
See application file for complete search history.

(56) References Cited

U.S. PATENT DOCUMENTS 5,091,823 A    2/1992    Kanbara
2011/0261588 A1    10/2011    Hattori
(Continued)

FOREIGN PATENT DOCUMENTS

JP    H02-290099 A    11/1990
JP    2009-106074 A    5/2009
(Continued)

OTHER PUBLICATIONS

International Search Report with English translation and Written Opinion issued in corresponding application No. PCT/JP2019/023808 dated Aug. 27, 2019.

*Primary Examiner* — Rafael O De Leon Domenech
(74) *Attorney, Agent, or Firm* — Foley & Lardner LLP

(57) ABSTRACT

An object of the present invention is to provide a power conversion device capable of reducing an influence of electromagnetic noise propagating from a circuit body toward a drive circuit board.
A power conversion device 100 of the present invention includes a circuit body 6 that converts a direct current into an alternating current, a drive circuit board 5 that drives the circuit body 6, a base member 4 provided between the circuit body 6 and the drive circuit board 5, and a case 1 that houses the circuit body 6 and the base member 4. The base member 4 includes a first flow channel forming portion 4A that forms a flow channel space 1C1 between the circuit body 6 and the base member 4, and a first extending portion 4B2 extending from the flow channel forming portion 4A and connected to an inner surface of the case 1.

9 Claims, 5 Drawing Sheets

(51) Int. Cl.
*H02M 1/44* (2007.01)
*H02M 7/00* (2006.01)
*H05K 7/20* (2006.01)

(56) References Cited

U.S. PATENT DOCUMENTS

| | | | | |
|---|---|---|---|---|
| 2013/0278194 | A1* | 10/2013 | Numakura | H05K 7/14322 318/400.27 |
| 2013/0294040 | A1* | 11/2013 | Fukumasu | B60L 15/20 361/752 |
| 2014/0313806 | A1* | 10/2014 | Shinohara | H01L 23/473 363/141 |
| 2015/0016063 | A1* | 1/2015 | Higuma | H02M 7/003 361/714 |
| 2015/0163961 | A1 | 6/2015 | Hara | |

FOREIGN PATENT DOCUMENTS

| | | |
|---|---|---|
| JP | 2011-001869 A | 1/2011 |
| JP | 2014-072938 A | 4/2014 |

* cited by examiner

ELECTROMAGNETIC SHIELDING POWER CONVERSION DEVICE

TECHNICAL FIELD

The present invention relates to a power conversion device that converts direct-current power into alternating-current power or converts alternating-current power into direct-current power, and more particularly, to a power conversion device suitable for being mounted on a vehicle.

BACKGROUND ART

As a background art of this technical field, a power conversion device described in JP 2014-072938 A (PTL 1) has been known. In the power conversion device of PTL 1, a first flow path forming body, a first base plate, a second flow path forming body, power semiconductor modules, a capacitor module, a drive circuit board, and a control circuit board are arranged in a case, and a cover covers the inside of the case in which these components are housed (see paragraph 0015). Among these components, the control circuit board is mounted on a second base plate, and the second base plate includes a first fixing part connected to a first support member extending from the first base plate, a second fixing part connected to a second support member extending from the second flow path forming body, and a third fixing part directly connected to the case (see paragraphs 0020 to 0024). In PTL 1, the terms "first", "second" and "third" are not used for the "first fixing part", "second fixing part" and "third fixing part", but in the present specification, the terms "first", "second", and "third" have been added in order to distinguish each fixing part. In the power conversion device, as the third fixing part is directly connected to the case, electromagnetic noise radiated from the power semiconductor module flows to the ground through the second base plate, the third fixing part, and the case, thereby protecting the control circuit board from the electromagnetic noise (see paragraph 0024).

In the power conversion device of PTL 1, as illustrated in FIG. 3, the first fixing part, the second fixing part, and the third fixing part are provided at five places along an outer periphery of the second base plate, in particular, the third fixing part is provided at one corner of the rectangular second base plate.

CITATION LIST

Patent Literature

PTL 1: JP 2014-072938 A

SUMMARY OF INVENTION

Technical Problem

A power semiconductor module includes a circuit body (current conversion circuit portion) that converts a direct current into an alternating current. Electromagnetic noise is generated in the current conversion circuit portion of the power semiconductor module, and propagates from the power semiconductor module or a connection wiring between the power semiconductor module and an electric circuit component arranged around the power semiconductor module toward the second base plate and the control circuit board. In the power conversion device of PTL 1, the electromagnetic noise propagating toward the control circuit board can be blocked by the second base plate, and the electromagnetic noise can flow from the second base plate to the ground through the case. In this case, the case serves as a ground reference corresponding to the ground potential.

The second base plate on which the control circuit board is mounted is in contact with the case at one corner of the rectangular shape. Therefore, in the second base plate, a portion connected to the case as the ground reference is limited to a narrow range (area) of one corner. Therefore, the power conversion device of PTL 1 has a limitation in enhancing the effect of reducing electromagnetic noise.

Hereinafter, the power semiconductor module that converts a direct current into an alternating current will be referred to as a circuit body, and a board that drives the circuit body will be referred to as a drive circuit board.

An object of the present invention is to provide a power conversion device capable of reducing an influence of electromagnetic noise propagating from a circuit body toward a drive circuit board.

Solution to Problem

In order to achieve the above-described object, in a power conversion device of the present invention, a contact portion that is in contact with an inner surface of a case is provided in a base member that supports a drive circuit board, thereby increasing the contact length or contact area of the contact portion, and making electromagnetic noise easily flow from the base member to the case.

Advantageous Effects of Invention

According to the present invention, it is possible to reduce the influence of electromagnetic noise propagating from the circuit body to the drive circuit board.

Problems, configurations, and effects other than those described above will become apparent by the following description of embodiments.

DESCRIPTION OF EMBODIMENTS

Figure 1:
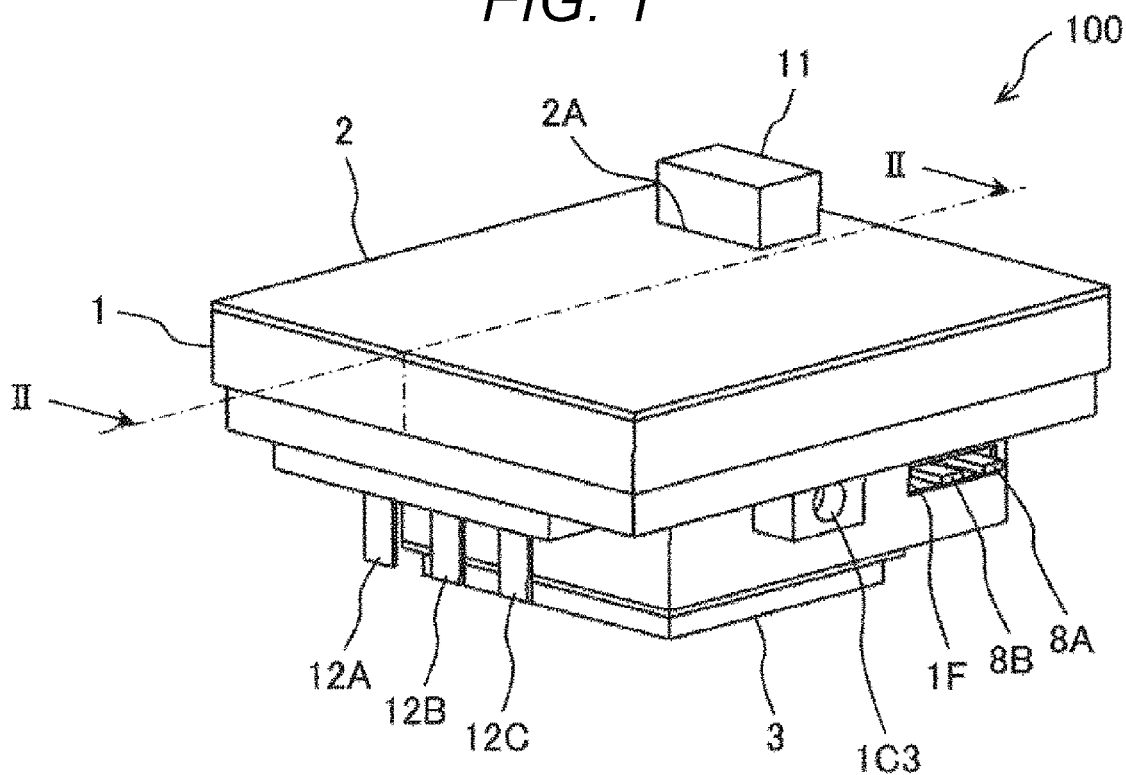
FIG. 1 is a perspective view of an appearance of a current conversion device 100 according to an embodiment of the present invention.

Hereinafter, a power conversion device according to an embodiment of the present invention will be described below with reference to the drawings. Note that, in FIGS. 1 to 6 described below, the same components are denoted by the same reference numerals, and an overlapping description is omitted.

The power conversion device according to an embodiment of the present invention is intended for a device used in hybrid vehicles or electric vehicles, and may also be a device used in other apparatuses, such as a home-use inverter in a refrigerator or air conditioner, or an industrial equipment inverter.

Figure 2:
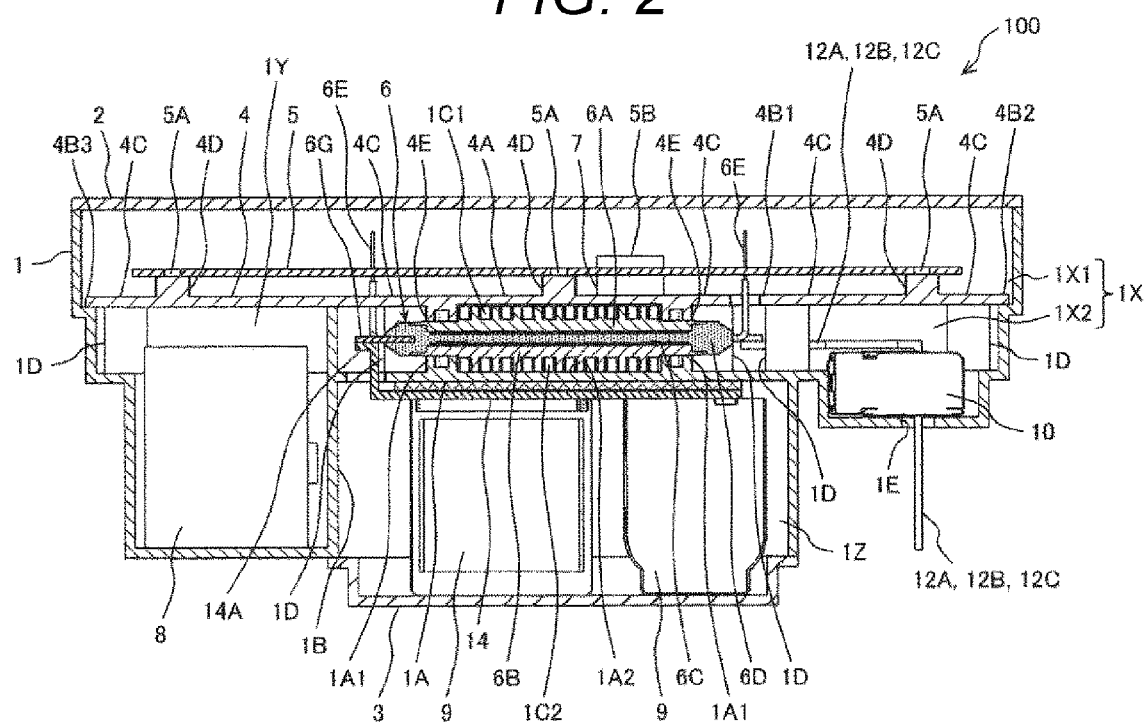
FIG. 2 is a cross-sectional view of the current conversion device 100 according to an embodiment of the present invention.

FIG. 1 is a perspective view of an appearance of a current conversion device 100 according to an embodiment of the present invention. FIG. 2 is a cross-sectional view of the current conversion device 100 according to an embodiment of the present invention. Note that FIG. 2 illustrates a cross section taken along line II-II of FIG. 1. In the following description, in designating and describing a top-bottom direction, the top-bottom direction is based on a top-bottom direction in FIG. 1 and does not necessarily match a top-bottom direction in a state where the power conversion device 100 is mounted.

As illustrated in FIG. 2, a case 1 houses a power semiconductor module 6, a drive circuit board (control circuit board) 5, a peripheral electric circuit component of the power semiconductor module 6, and the like, and an upper end of the case 1 is covered by a top cover (first cover) 2 and a lower end of the case 1 is covered by a bottom cover (second cover) 3.

As illustrated in FIG. 1, an outlet pipe connecting portion 1C3 and an inlet pipe connecting portion (not illustrated) for a cooling medium are provided at side surfaces of the case 1, respectively. The inlet pipe connecting portion is provided at the side surface opposite to the side surface at which the outlet pipe connecting portion 1C3 is provided. The cooling medium is introduced into the power conversion device 100 through the inlet pipe connecting portion, discharged to the outside of the power conversion device 100 through the outlet pipe connecting portion 1C3, and circulates inside and outside the power conversion device 100.

The case 1 has an opening 1E, and AC bus bars 12A, 12B, and 12C are inserted through the opening 1E and protrude from the inside of the case 1 to the outside. The AC bus bars 12A, 12B, and 12C are wiring members (conductive members) that output an AC current, the AC bus bar 12A is associated with a U phase, the AC bus bar 12B is associated with a V phase, and the AC bus bar 12C is associated with a W phase. The AC bus bars 12A, 12B, and 12C are connected to a motor (not illustrated) and perform AC power transfer with the motor.

Further, the case 1 has another opening 1F, and a DC positive electrode terminal 8A and a DC negative electrode terminal 8B are inserted through the opening 1F and protrude from the inside of the case 1 to the outside.

The DC positive electrode terminal 8A and the DC negative electrode terminal 8B are connected to a battery and perform DC power transfer.

A signal connector 11 protrudes upward from the top cover 2. The signal connector 11 is attached to the drive circuit board 5, passes through an opening 2A formed in the top cover 2, and protrudes from the inside of the case 1 to the outside.

The signal connector 11 is connected to a host control device provided in the vehicle to perform transmission and reception of a signal.

As illustrated in FIG. 2, the case 1 is partitioned by a first partition wall 1A and a second partition wall 1B into a first space (first housing chamber) 1X, a second space (second housing chamber) 1Y, and a third space (third housing chamber) 1Z. Further, the first space 1X is partitioned by a base member 4 into an upper space 1X1 and a lower space 1X2.

In the first space 1X, the base member 4, the drive circuit board 5, the power semiconductor module (circuit body) 6, and a current sensor 10 are housed as main housed components. The drive circuit board 5 is arranged in the upper space 1X1. The power semiconductor module 6 and the current sensor 10 are arranged in the lower space 1X2. Therefore, the upper space 1X1 constitutes a housing space (housing chamber) for the drive circuit board 5, and the lower space 1X2 constitutes a housing space (housing chamber) for the power semiconductor module 6 and the current sensor 10.

The base member 4 that divides the upper space 1X1 and the lower space 1X2 is fixed so that fixing portions 4C are fixed to a plurality of case-side base member fixing portions 1D provided in the case 1, respectively. As a specific fixing method, for example, fastening with a screw can be used. The base member 4 is fixed so that an outer peripheral edge of the base member 4 is in contact with an inner surface of the case 1 and an upper end of the second partition wall 1B when fixed to the case-side base member fixing portions 1D.

The drive circuit board 5 arranged in the upper space 1X1 is mounted on the base member 4, and fixing portions 5A are fixed to a plurality of base-member-side board support portions 4D provided on the base member 4, respectively. The plurality of base-member-side board support portions 4D are formed as convex portions that protrude upward from an upper surface of the base member 4. As a specific fixing method, for example, fastening with a screw can be used. As a result, the drive circuit board 5 is directly supported by the base member 4.

In the lower space 1X2, the power semiconductor module 6 is arranged at the center in a left-right direction in FIG. 2, and the current sensor 10 is arranged in a right end space in the left-right direction in FIG. 2. In the cross-section of FIG. 2, a flow channel wall 1A1 is formed on the first partition wall 1A of the case 1, and a flow channel wall 4E is formed on the base member 4 in the center portion in the left-right direction. The flow channel wall 1A1 is formed so as to protrude upward (toward the base member 4) from the first partition wall 1A. The flow channel wall 4E is formed so as to protrude downward (toward the first partition wall 1A) from the base member 4. A first flow channel forming portion 4A is formed on the flow channel wall 4E of the base member 4 and an inner side of the flow channel wall 4E. A second flow channel forming portion 1A2 is formed on an inner side of the flow channel wall 1A1 of the first partition wall 1A.

Note that the left-right direction in FIG. 2 is a direction along a plate surface of the base member 4 and a wall surface of the first partition wall 1A, and is parallel to the plate surface of the base member 4 and the wall surface of the first partition wall 1A.

The power semiconductor module 6 is arranged so as to be sandwiched between the flow channel wall 1A1 and the flow channel wall 4E, such that a lower surface of the power semiconductor module 6 faces the first partition wall 1A of the case 1 and an upper surface of the power semiconductor module 6 faces the base member 4. Thereby, a first flow channel portion (first flow channel space) 1C1 is formed between the upper surface of the power semiconductor module 6 and a lower surface of the base member 4, and a second flow channel portion (second flow channel space) 1C2 is formed between the lower surface of the power semiconductor module 6 and an upper surface of the first partition wall 1A. The first flow channel portion 1C1 and the second flow channel portion 1C2 communicate with the outlet pipe connecting portion 1C3 and the inlet pipe connecting portion provided on the side surfaces of the case 1, and the cooling medium flows in the first flow channel portion 1C1 and the second flow channel portion 1C2 through the inlet pipe connecting portion and the outlet pipe connecting portion 1C3.

The current conversion device 100 includes a current conversion circuit portion 6C that converts a direct current into an alternating current, and the drive circuit board 5 that drives the current conversion circuit portion 6C. In the present embodiment, since a control circuit is mounted on the drive circuit board 5, the drive circuit board 5 may be referred to as a control circuit board.

The power semiconductor module 6 receives DC power supplied from a DC positive electrode terminal 8A and a DC negative electrode terminal 8B via a filter circuit 8 and a smoothing capacitor 9, and converts the DC power into AC power in the current conversion circuit portion 6C. The filter circuit 8 is arranged in the second space (second housing chamber) 1Y of the case 1, and the smoothing capacitor 9 is arranged in the third space (third housing chamber) 1Z of the case 1. The second space 1Y constitutes a housing space (housing chamber) for the filter circuit 8, and the third space 1Z constitutes a housing space (housing chamber) for the smoothing capacitor 9.

A DC bus bar 14 is provided on a lower surface of the first partition wall 1A of the case 1.

That is, the DC bus bar 14 is arranged on a surface of the first partition wall 1A that faces the smoothing capacitor 9. The DC bus bar 14 includes two DC bus bars, a positive-electrode DC bus bar and a negative-electrode DC bus bar. The smoothing capacitor 9 is electrically connected to the DC bus bar 14, and a terminal portion 14A bent upward is connected to a DC terminal 6G of the power semiconductor module 6. As a result, the DC bus bar 14 connects the power semiconductor module 6, the smoothing capacitor 9, and the filter circuit 8 to one another, and transfers a current supplied from the DC positive electrode terminal 8A and the DC negative electrode terminal 8B to the power semiconductor module 6.

As described above, the case 1 includes the filter circuit 8 including the DC terminals 8A and 8B, the smoothing capacitor 9, the base member 4, the drive circuit board 5, the power semiconductor module 6, the current sensor 10, the DC bus bar 14, and the AC bus bars 12A, 12B, and 12C therein. Note that the DC terminals 8A and 8B and the AC bus bars 12A, 12B, and 12C are partially exposed to the outside of the case and are electrically connected to an external device.

The top cover 2 closes the opening on the upper side of the case 1 to protect the components in the case 1 as a lid. The signal connector 11 transmits and receives a signal to and from the outside and transfers the signal to the drive circuit board 5. The AC bus bars 12A, 12B, and 12C receive AC power from the power semiconductor module 6 and transfer the AC power to the motor.

Figure 3:
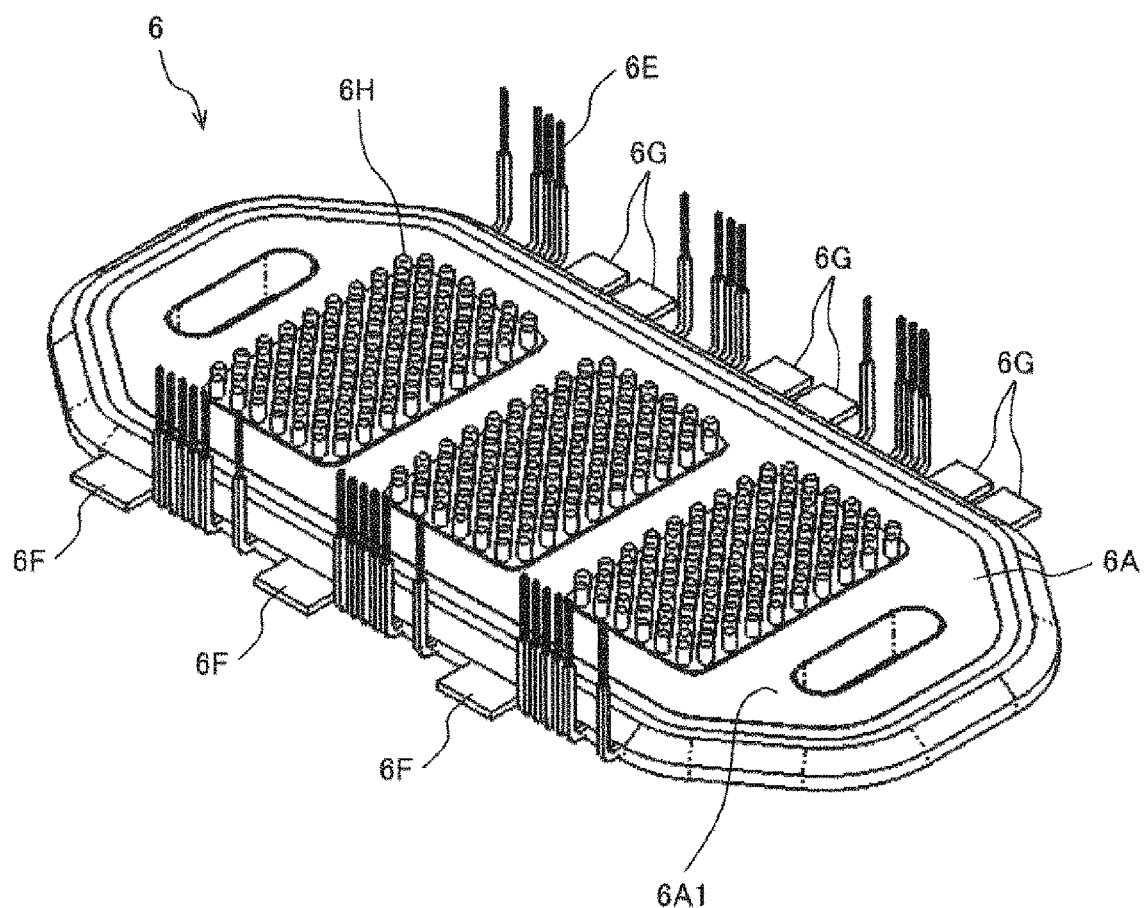
FIG. 3 is a perspective view of a power semiconductor module 6 of the current conversion device 100 according to an embodiment of the present invention as viewed from a base member 4.

The configuration of the power semiconductor module 6 will be described with reference to FIG. 3 together with FIG. 2. FIG. 3 is a perspective view of the power semiconductor module 6 of the current conversion device 100 according to an embodiment of the present invention as viewed from the base member 4.

The current conversion circuit portion 6C includes a switching element such as an insulated gate bipolar transistor (IGBT) or a diode. Further, the current conversion circuit portion 6C may include a lead frame that transfers a current flowing through the switching element and a resin sealing body 6D that seals the lead frame and the switching element. Note that the lead frame is exposed from the resin sealing body 6D and constitutes the DC terminal 6G and an AC terminal 6F (FIG. 3).

The power semiconductor module 6 includes the current conversion circuit portion 6C, a first fin base 6A, and a second fin base 6B. The current conversion circuit portion 6C includes a signal terminal 6E that receives a drive signal from the drive circuit board 5. The first fin base 6A and the second fin base 6B interpose the current conversion circuit portion 6C therebetween, and outer surfaces of the first fin base 6A and the second fin base 6B come into direct contact with the cooling medium. That is, an upper surface of the first fin base 6A is exposed in the first flow channel portion 1C1 and a lower surface of the second fin base 6B is exposed in the second flow channel portion 1C2.

The power semiconductor module 6 includes the DC terminal 6G connected to the DC bus bar 14, the AC terminal 6F connected to the AC bus bars 12A, 12B, and 12C, and the signal terminal 6E connected to the drive circuit board 5. The number of each of DC bus bars 14, DC terminals 6G, AC bus bars 12A, 12B, and 12C, AC terminals 6F, and signal terminals 6E provided is plural.

The first fin base 6A and the second fin base 6B include a heat dissipation fin 6H, and the heat dissipation fin 6H dissipates heat generated by the power semiconductor module 6 to a cooling water passage including the first flow channel portion 1C1 and the second flow channel portion 1C2.

Figure 4:
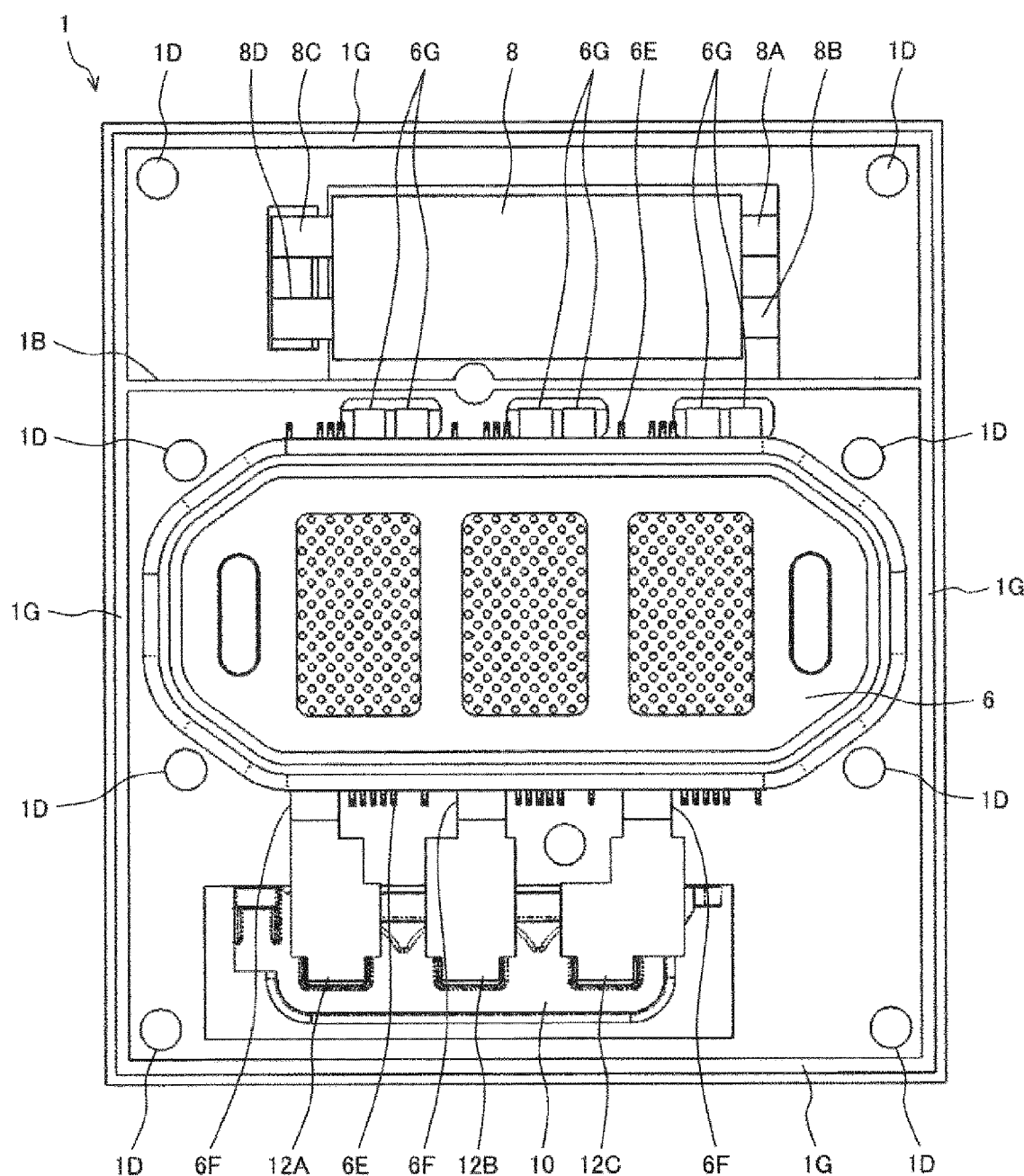
FIG. 4 is a plan view of the current conversion device 100 according to an embodiment of the present invention, in which a top cover 2, a control circuit board 5, and the base member 4 are removed, and the inside of a case 1 is viewed from above in FIG. 1.

An internal configuration of the case 1 and an electric wiring of the power semiconductor module 6 will be described with reference to FIG. 4. FIG. 4 is a plan view of the current conversion device 100 according to an embodiment of the present invention, in which the top cover 2, the control circuit board 5, and the base member 4 are removed, and the inside of the case 1 is viewed from above in FIG. 1.

In the case 1, the fixing portions (base member fixing portions) 1D that fix the base member 4 and a contact portion 1G that is in contact with an outer peripheral portion (outer edge portion) of the base member 4 are provided. The contact portion 1G constitutes a base member receiving portion that receives the base member 4. The case 1 has a rectangular outer shape in a plane illustrated in FIG. 4. The contact portion 1G is formed on an inner peripheral side of an outer peripheral wall portion (side wall portion) 1H having the rectangular shape. The contact portion 1G is formed over an entire periphery of the outer peripheral wall portion 1H along the inner peripheral surface of the outer peripheral wall portion 1H.

The fixing portions 1D are arranged at a plurality of positions on the inner side as compared with the contact portion 1G. In the present embodiment, as the fixing portions 1D are arranged at least at four corners of the outer peripheral wall portion 1H, and in the middle of the second partition wall 1B, the base member 4 is in close contact with upper edges of the contact portion 1G and the second partition wall 1B when the base member 4 is fixed to the fixing portions 1D.

The filter circuit 8 is electrically connected to the DC bus bar 14 via the terminals 8C and 8D in the filter circuit housing space 1Y. As a result, the filter circuit 8 is electrically connected to the smoothing capacitor 9 via the DC bus bar 14.

The current conversion circuit portion 6C of the power semiconductor module 6 is electrically connected to the DC bus bar 14 and the smoothing capacitor 9 in the power semiconductor module housing space 1X2.

The second partition wall 1B of the case 1 constitutes a filter shielding wall between the power semiconductor module 6 and the filter circuit 8. Since the filter circuit 8 is shielded from the power semiconductor module 6 by the second partition wall 1B and the base member 4, electromagnetic noise generated in the power semiconductor module 6 can be suppressed from propagating to the filter circuit 8.

The AC terminals 6F of the power semiconductor module 6 are connected to the AC bus bars 12A, 12B, and 12C, and are electrically connected to an external motor through the current sensor 10 housed in the case 1. The current sensor 10 is electrically connected to the drive circuit board 5 and transmits and receives a signal for controlling the motor to and from the drive circuit board 5. For this, the current sensor 10 is provided with a sensor connection cable (not illustrated), and the sensor connection cable is electrically connected to the drive circuit board 5 through a cutout portion 4H (see FIG. 5) of the base member 4.

Figure 5:
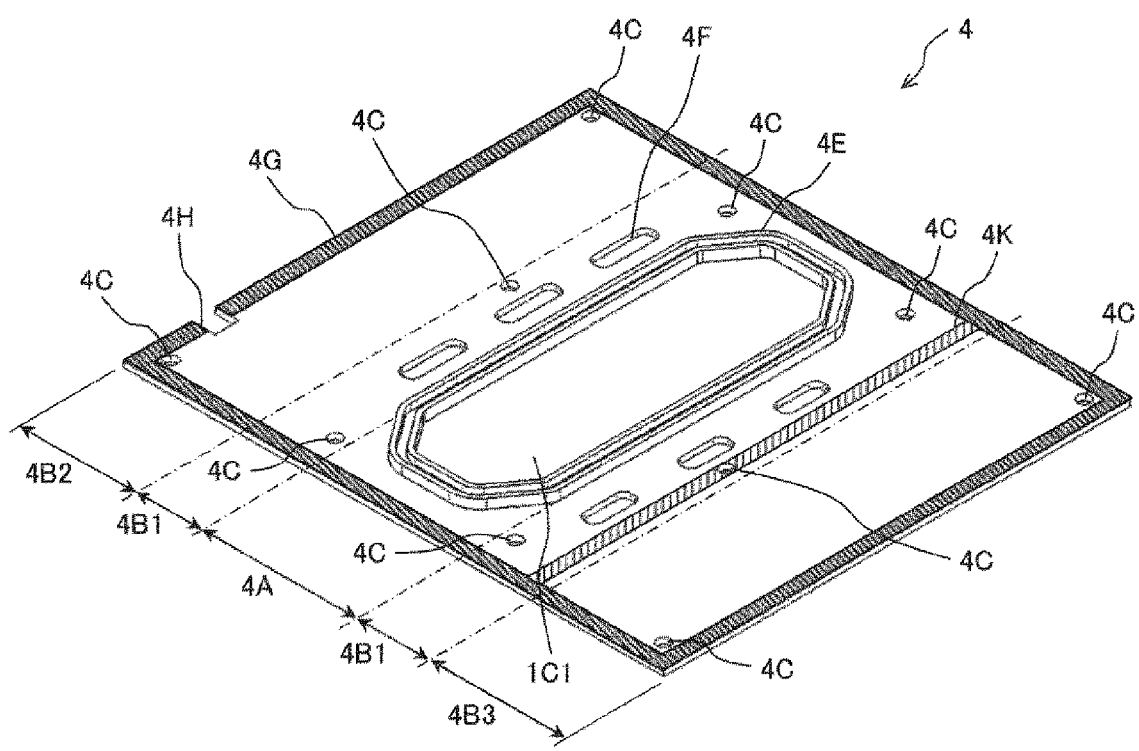
FIG. 5 is a perspective view of the base member 4 of the current conversion device 100 according to an embodiment of the present invention as viewed from a current conversion circuit.

The base member 4 will be described with reference to FIG. 5. FIG. 5 is a perspective view of the base member 4 of the current conversion device 100 according to an embodiment of the present invention as viewed from a current conversion circuit.

A contact portion 4G that is in contact with the contact portion 1G (case-side contact portion) of the case 1 is provided at the outer peripheral edge of the base member 4. The contact portion 4G constitutes a base-member-side contact portion that is in contact with the case-side contact portion 1G. The above-described cutout portion 4H is formed in the outer peripheral edge of the base member 4. The cutout portion 4H constitutes a cutout portion through which the sensor connection cable passes. In the present embodiment, only the cutout portion 4H is a portion that is not in contact with the case-side contact portion 1G. For other purposes, a portion that is not in contact with the case-side contact portion 1G may be further provided. However, in order to make a contact area with the case-side contact portion 1G larger, the number of non-contact portions and the area of the non-contact portion are preferably as small as possible. In the present embodiment, a ratio of the length of the non-contact portion to the length of the outer peripheral edge of the base member 4 is less than 1/10 (10%).

Further, in the base member 4, the first flow channel forming portion 4A is provided at the center of the base member 4 in a first direction parallel to the plate surface of the base member 4, and second extending portions 4B1 extending from the first flow channel forming portion 4A in the first direction are provided on opposite sides of the first flow channel forming portion 4A in the first direction.

Furthermore, a first extending portion 4B2 and a third extending portion 4B3 extend from the second extending portions 4B1, respectively, in the first direction toward a direction away from the first flow channel forming portion 4A. The first extending portion 4B2 is a portion extending above the current sensor 10, and the third extending portion 4B3 is a portion extending above the filter circuit 8.

A plurality of through holes 4F into which the signal terminals 6E are inserted are formed in the second extending portion 4B1. Outer peripheral edge portions of the base member 4 in the first extending portion 4B2 and the third extending portion 4B3 constitute a part of the base-member-side contact portion 4G. Among outer peripheral edge portions 4G of the first extending portion 4B2, the second extending portion 4B1, and the third extending portion 4B3, outer peripheral edge portions positioned at opposite ends in a second direction parallel to the plate surface of the base member 4 and orthogonal to the first direction also constitute a part of the base-member-side contact portion 4G.

The first flow channel forming portion 4A, the second extending portion 4B1, the first extending portion 4B2, and the third extending portion 4B3 are integrally formed, such that the base member 4 has a favorable thermal conductivity. Further, a portion 4K indicated by Reference Numeral 4K constitutes a filter shielding wall contact portion that is in contact with the second partition wall (filter shielding wall) 1B illustrated in FIG. 4.

The base member 4 is formed of metal, and the flow channel wall 4E is also formed of metal. The first fin base 6A of the power semiconductor module 6 is also formed of metal, and the flow channel wall 4E is provided so as to be in contact with a flow channel forming portion 6A1 of the first fin base 6A. Note that, in the present embodiment, the case 1 is also formed of metal, and the flow channel wall 1A1 is also formed of metal. The second fin base 6B of the power semiconductor module 6 is also formed of metal, and is provided so as to be in contact with a flow channel forming portion (a portion corresponding to the flow channel forming portion 6A1 of the first fin base 6A) of the second fin base 6B.

Electromagnetic noise from the power semiconductor module 6 is transferred from the metal flow channel forming portion 6A1 to the flow channel wall 4E of the base member 4. The electromagnetic noise transferred to the flow channel wall 4E is dropped into the case 1 via the outer peripheral edge portion 4G of the base member 4. Further, the electromagnetic noise transferred to the flow channel wall 4E is dropped into the case 1 via the case-side base member fixing portion 1D and the second partition wall (filter shielding wall) 1B.

Further, the heat generated by the power semiconductor module 6 is dissipated to the cooling medium in the cooling water passage formed by the first flow channel forming portion 4A and the second flow channel forming portion 1A2. Further, a heating element 5B on the drive circuit board 5 dissipates heat to the cooling medium in the cooling water passage formed by the first flow channel forming portion 4A via a heat dissipating portion 7 provided on the base member 4.

Figure 6:
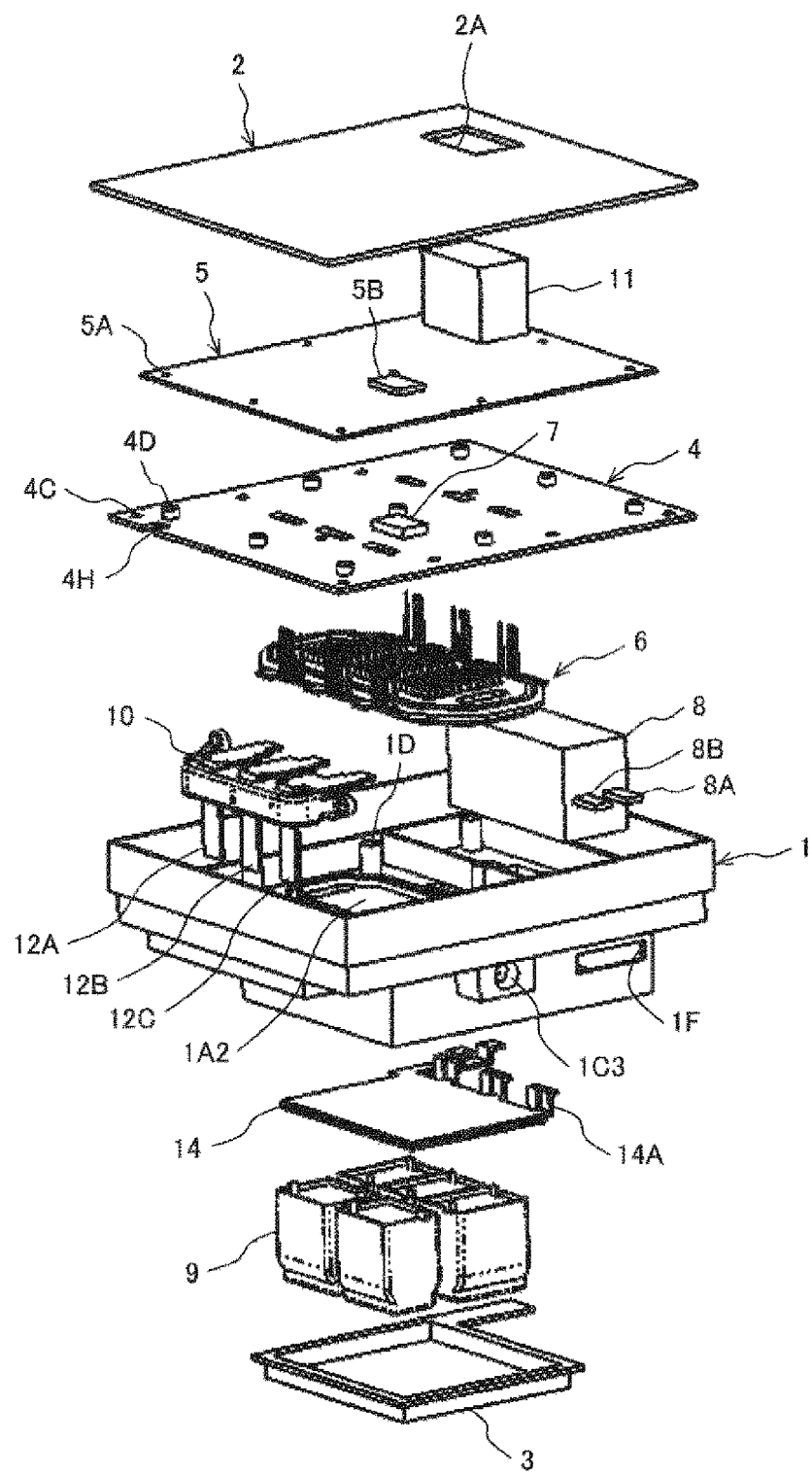
FIG. 6 is an exploded perspective view of the current conversion device 100 according to an embodiment of the present invention.

The configuration of the current conversion device 100 will be further described with reference to FIG. 5 together with FIG. 2. FIG. 6 is an exploded perspective view of the current conversion device 100 according to an embodiment of the present invention.

In the present embodiment, as illustrated in FIG. 5, the drive circuit board 5, the base member 4, the power semiconductor module 6, the filter circuit 8, and the current sensor 10 are inserted into the case 1 through the opening of the case 1 that faces the top cover 2 and assembled. On the other hand, the DC bus bar 14 and the smoothing capacitor 9 are inserted into the case 1 through an opening of the case 1 that faces a bottom cover 3 and assembled.

The outer peripheral edge of the base member 4 is in contact with the contact portion (base member receiving portion) 1G of the case 1, and the base member 4 covers the power semiconductor module 6, the filter circuit 8, and the current sensor 10 from above, such that the base member 4 serves as an intermediate cover arranged on the inner side of the top cover 2. The top cover 2 covers the drive circuit board 5 and the base member 4 from above and closes the opening on the upper side of the case 1. The bottom cover 3 closes the opening on the lower side of the case 1 to protect the smoothing capacitor 9.

Next, the actions and effects of the power conversion device 100 according to present embodiment will be described.

In the present embodiment, the outer peripheral edge portion 4G of the base member 4 is in contact with the case 1 and the base member 4 functions as a shielding wall that divides a housing area for the power semiconductor module 6 (current conversion circuit portion 6C) and a housing area for the drive circuit board 5. The base member 4 reduces an influence of noise from the current conversion circuit portion 6C on the drive circuit board 5. On a side of the base member 4 that faces the current conversion circuit portion 6C, the first flow channel forming portion 4E that forms the flow channel space 1C1 is provided. The base member 4 includes the heat dissipating portion 7 that cools the heating element 5B on the drive circuit board 5.

The DC terminals 8A and 8B receive DC power from a battery (not illustrated) and transfer the DC power to the filter circuit 8. The filter circuit 8 removes electromagnetic noise included in the DC power supplied from a DC power supply, and transfers the DC power to the smoothing capacitor 9.

The smoothing capacitor 9 absorbs a pulsating current of DC power to reduce a pulsating component, thereby smoothing the current. The DC bus bar 14 connects the current conversion circuit portion 6C and the smoothing capacitor 9 to each other. The power semiconductor module 6 and the case 1 form the flow channel space 1C2. Therefore, the second flow channel forming portion 1A2 is formed in the first partition wall 1A of the case 1.

The filter circuit 8 that passes a DC current to the current conversion circuit portion 6C has a high impedance with respect to a high-frequency current, and functions as a low-pass filter, thereby removing electromagnetic noise included in DC power. The third extending portion 4B3 extending from the base member 4 is in contact with the second partition wall 1B of the case 1, blocks between the filter circuit 8 and the current conversion circuit portion 6C, and forms the filter circuit area (second space or second housing chamber) 1Y. The third extending portion 4B3 functions as a shielding wall that forms the filter circuit area 1Y, and reduces an influence of electromagnetic noise from the current conversion circuit portion 6C on the filter circuit 8.

In the present embodiment, the first extending portion 4B2 and the third extending portion 4B3 that drop electromagnetic noise from the outer peripheral edge portion 4G of the base member 4 to the ground via the case 1 that is a housing are provided. The first extending portion 4B2 and the third extending portion 4B3 are in direct contact with the inner surface of the case 1. More specifically, the first extending portion 4B2 and the third extending portion 4B3 each include the fixing portion 4C fixed to the case-side base member fixing portion 1D of the case 1 by a fixing member, and the contact portion 4G that is different from the fixing portion 4C and in is contact with the inner surface of the case 1. As a result, it is possible to reduce an influence of electromagnetic noise from the current conversion circuit portion 6C on the drive circuit board 5.

Note that the present invention is not limited to the respective embodiments described above, but includes various modified examples. For example, the above-described embodiments have been described in detail in order to describe the present invention in an easy-to-understand manner, and the present invention is not necessarily limited to those having all the configurations. Further, a part of a configuration of an embodiment can be replaced with a configuration of another embodiment, and a configuration of an embodiment can be added with a configuration of another embodiment. In addition, a part of the configuration of each embodiment can be added with another configuration, can be deleted, and can be replaced with another configuration.

REFERENCE SIGNS LIST 1 case
1A2 second flow channel forming portion
1C2 flow channel space
6 circuit body
5 drive circuit board
4 base member
4A first flow channel forming portion
4B1 second extending portion
4B2 first extending portion
4B3 third extending portion
4C fixing portion
4G contact portion
4F through hole
6E signal terminal
8 filter circuit
1Y space where filter circuit is arranged
100 power conversion device

The invention claimed is:

1. A power conversion device comprising:
   a circuit body that converts a direct current into an alternating current;
   a drive circuit board that drives the circuit body;
   a base member provided between the circuit body and the drive circuit board; and
   a case that houses the circuit body and the base member,
   wherein the base member includes a first flow channel forming portion that forms a flow channel space between the circuit body and the base member, and
   a first extending portion extending from the first flow channel forming portion and connected to an inner surface of the case.

2. The power conversion device according to claim 1, wherein the first extending portion includes a fixing portion fixed to the case by a fixing member, and a contact portion that is different from the fixing portion and is in contact with the inner surface of the case.

3. The power conversion device according to claim 1, wherein the circuit body includes a signal terminal that receives a drive signal from the drive circuit board,
   the base member includes a second extending portion extending from the first flow channel forming portion to the vicinity of the signal terminal, and
   a through hole through which the signal terminal passes is formed in the second extending portion.

4. The power conversion device according to claim 1, wherein the case includes a second flow channel forming portion that forms a flow channel space between the circuit body and the case.

5. The power conversion device according to claim 1, further comprising a filter circuit that passes the direct current,
   wherein the base member includes a third extending portion extending from the first flow channel forming portion so as to separate the drive circuit board and a space where the filter circuit is arranged.

6. The power conversion device according to claim 2, further comprising a filter circuit that passes the direct current,
   wherein the base member includes a third extending portion extending from the first flow channel forming portion so as to separate the drive circuit board and a space where the filter circuit is arranged.

7. The power conversion device according to claim 3, further comprising a filter circuit that passes the direct current,
   wherein the base member includes a third extending portion extending from the first flow channel forming portion so as to separate the drive circuit board and a space where the filter circuit is arranged.

8. The power conversion device according to claim 1, further comprising a signal connector coupled to the drive circuit board,
   wherein the signal connector extends from the drive circuit board through an opening in the case.

9. The power conversion device according to claim 1, further comprising a power semiconductor, the power semiconductor including a current conversion circuit, a first fin base, a second fin base, and a plurality of signal terminals,
   wherein each of the plurality of signal terminals extends orthogonally from the first fin base.

\* \* \* \* \*